(12) United States Patent
Schulze

(10) Patent No.: US 6,363,296 B1
(45) Date of Patent: Mar. 26, 2002

(54) SYSTEM AND METHOD FOR AUTOMATED DEFECT INSPECTION OF PHOTOMASKS

(75) Inventor: Steffen Schulze, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/256,930

(22) Filed: Feb. 24, 1999

(51) Int. Cl.[7] ................................................ G06F 7/66
(52) U.S. Cl. ........................ 700/125; 700/121; 250/370
(58) Field of Search ................................. 700/279, 244, 700/121, 74, 150, 143, 125; 250/370, 310; 382/145; 716/19

(56) References Cited

U.S. PATENT DOCUMENTS 4,247,203 A * 1/1981 Levy et al. .................. 356/398
4,659,220 A * 4/1987 Bronte et al. ............... 356/237
4,926,489 A * 5/1990 Danielson et al. ............. 382/8
6,048,649 A * 4/2000 Burke et al. ................... 430/5

* cited by examiner

*Primary Examiner*—William Grant
*Assistant Examiner*—Kidest Bahta

(57) ABSTRACT

A method for inspecting photomasks, in accordance with present invention includes the step of providing a design data set for fabricating a photomask, searching the design data set for sub-groundrule features, eliminating the sub-groundrule features from the data set to form an inspection data set and inspecting a photomask fabricated in accordance with the design data set by employing the inspection data set. A system for executing the steps in accordance with the present invention is also provided.

20 Claims, 6 Drawing Sheets

SYSTEM AND METHOD FOR AUTOMATED DEFECT INSPECTION OF PHOTOMASKS

BACKGROUND OF THE INVENTION

1. Technical Field

This disclosure relates to semiconductor fabrication tools and more particularly, to an improved system and method for automated defect inspection of photomasks.

2. Description of the Related Art

Semiconductor fabrication processes typically include photolithographic processing to pattern areas of a surface of a semiconductor device. The semiconductor fabrication process typically includes applying a photoresist material to the surface of the semiconductor device. The photoresist is patterned by exposing the photoresist to light, typically ultraviolet light, to crosslink the resist material. This cross linking prevents a reaction with a developer which develops away areas of the photoresist which were not crosslinked by the exposure to the UV light. Other types of photoresists are prevented from crosslinking in when exposed to ultraviolet light.

Photoresists are patterned using a photomask. The photomask functions as a shield to prevent light form passing through it in predetermined areas during photolithography. The photomask typically provides a black or highly absorbent layer of material, usually chromium or a chromium alloy, patterned in accordance with the patterning design to be projected onto the photoresist. The absorbent layer is formed on a substrate, which may include a glass or quartz material.

With decreasing feature sizes of semiconductor components, photomasks are increasingly more difficult to fabricate and inspect to ensure acceptable results. The defect inspection capability of these photomasks is limited to a certain minimum feature size. This minimum feature size is typically the groundrule of the features which photomask is used to produce, i.e, 150 nm minimum feature size for 1×mask magnification or 600 nm at 4×mask magnification).

Since photomasks include a multitude of features below a micron in size, inspections of photomasks are performed using automated inspection devices. Referring to FIG. 1, a measuring apparatus 10 includes a stage 14 for positioning a photomask 16 to be measured. An energy source 18 irradiates photomask 16 with a predetermined intensity of light. A photosensitive device or sensor 20 collects reflected and/or transmitted intensities and stores the data in a storage device 22. A processor 24 is used to perform calculations for determining correct feature sizes according to transmitted and reflected intensities. Processor 24 includes a data set to which to compare intensity profiles of the photomask to be inspected. Primarily two system of inspection are used for inspecting photomasks. One is a die-to-die approach. The die-to-die approach compares features of the photomask against similar features of the same photomask to determine if any defects exist. Typically, an ultraviolet laser is used to transmit light through the photomask to be inspected and the master photomask. Light intensities are measured for transmitted and/or reflected light to compare the patterns of the two photomasks. A second approach includes a die-to-database measurement systems. A reference database computer (RDC) is included in processor 24 to provide a digital image used to compare against the photomask to be inspected. This is the most accurate technique in verifying that the original circuit has been correctly transferred to the photomask. A laser beam is propagated through or reflected from the photomask to be inspected and the intensity at a particular location is compared to the digital image.

Both of the approaches have the inspection capability for complex reticle patterns, including those with narrow geometries, dense optical proximity correction (OPC) and phase shift masks (PSM). OPC helps compensate for lost light to ensure that the precise patterns are formed on a semiconductor wafer. For example, without OPC, a rectangle can end up looking like an oval on the wafer because light tends to round on the edges. OPC corrects this by adding tiny serifs (lines) to the corner to ensure that the corners are not rounded or moving a feature edge so wafer features are sized more accurately. Phase shift masks alter the phase of light passing through the photomask, and permit improved depth of focus and resolution on the wafer. Phase-shift helps reduce distortion on line resolution of wafer surface irregularities.

In conventional automated systems, a certain number of sub-groundrule features may cause a failure in the inspection of the photomask. To image successfully sub-micron features on a silicon wafer, sub-groundrule features on the photomask become increasingly more likely.

In one example, an active area mask (photo mask) is used in the formation of active area (AA) features for trench type dynamic random access memory (DRAM) designs. To equalize shortening of length for features due to corner rounding, asymmetric biases are applied to the designed features on the photomask. Biasing includes shrinking or growing geometries either through data base manipulation (data base biasing) or through process control (process biasing). With decreasing groundrules these biases tend to become larger. As shown in FIG. 2, an example of biasing is shown. A design pattern for a line 40 has a groundrule of 175 nm and is desired to be 1050 in length and 350 nm away from another line 42 which is also 1050 nm in length. Data for a photomask is biased by a 200 nm bias for lines 40' and 42' to achieve the design lengths for lines 40 and 42. However, the length of 1250 nm forms a space 44 of 150 nm, i.e., a sub-groundrule feature.

Depending on an unused cell design, these biases often result in sub-groundrule feature sizes on the respective photomasks used in the imaging process. For 150 nm groundrules, for example, the space between adjacent AA features along an axis is about 300 nm in data stored for the design dimensions. A length bias of more than 75 nm per shape results in a sub-groundrule feature on the mask (see also FIG. 2). A similar situation may occur due to the presence of serifs in masks written from data sets corrected for optical proximity as well as due to the presence of assist features in chrome on glass (COG) or phase shift masks.

As shown in FIG. 3, serifs 50 and 52 are illustratively shown for a mask. Serifs 50 and 52 and lines 53 are used to produce lines 54 and 56, respectively. Other assist features may also used, for example assist features 58, 60 and 62 may be used to provide structures 64 and 66, respectively as shown in FIG. 4. Serifs and assist features often produce sub-groundrule features on the photomask.

Due to these sub-groundrule features fabricated on photomasks, the photomasks are not defect inspectable. Therefore, a need exists for a system and method which eliminates defect failures of photomasks due to benign sub-groundrule features on the photomask.

SUMMARY OF THE INVENTION

A method for inspecting photomasks, in accordance with present invention includes the steps of providing a design data set for fabricating a photomask, searching the design data set for sub-groundrule features, eliminating the sub-groundrule features from the data set to form an inspection data set and inspecting a photomask fabricated in accordance with the design data set by employing the inspection data set.

Another method for inspecting photomasks includes the steps of providing a design data set for fabricating a photomask, identifying sub-groundrule features in the design data set which meet predetermined size criteria, forming an inspection data set by eliminating the identified sub-groundrule features from the design data set, providing an inspection tool for comparing a photomask fabricated in accordance with the design data set to the data of the inspection data set, adjusting the inspection tool such that identified sub-groundrule features are overlooked and inspecting the fabricated photomask by employing the inspection data set.

A program storage device readable by machine, tangibly embodying a program of instructions executable by the machine to perform method steps for inspecting photomasks, the method steps include providing a design data set for fabricating a photomask, searching the design data set for sub-groundrule features, eliminating the sub-groundrule features from the data set to form an inspection data set and inspecting a photomask fabricated in accordance with the design data set by employing the inspection data set.

In alternate methods, which may be executable by machine to perform method steps for inspecting photomasks, the sub-groundrule features may include sub-groundrule spaces and the step of eliminating the sub-groundrule features may further include the step of merging features of the design data set which are adjacent to the spaces such that the space are eliminated in the inspection data set. The step of merging features may includes merging features by employing a biasing process. The photomask may include sub-groundrule lines and the step of eliminating the sub-groundrule features may further include the step of removing the sub-groundrule lines from the design data set to provide the inspection data set. The step of searching the design data set for sub-groundrule features may include the step of searching the design data set for sub-groundrule features according to predetermined feature size criteria. The step of inspecting the photomask fabricated in accordance with the design data set by employing the inspection data set may include the step of adjusting a sensitivity of an inspection tool to overlook the sub-groundrule features. The step of providing a design data set for fabricating a photomask may include providing a computer rendered digital pattern for fabricating the photomask.

In still other methods, the step of forming an inspection data set may further include the step of merging features of the design data set which are adjacent to the spaces such that the spaces are eliminated in the inspection data set and/or the step of removing the sub-groundrule lines from the design data set to provide the inspection data set. The step of searching the design data set for sub-groundrule features may include the step of searching the design data set for sub-groundrule features according to predetermined feature size criteria.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication tools and more particularly, to an improved system and method for automated defect inspection of photomasks. The present invention includes methods for eliminating sub-groundrule features from a data set used as a reference for comparing to actual photomask features. A system is also provided for implementing these methods. In one embodiment, the detection sensitivity is decreased such that features smaller than a predetermined size are no longer detectable. In this way, the photomask becomes more inspectable since sub-groundrule features are no longer discernable to cause inspection failures. One way of providing the advantageous results of the present invention is to manipulate an inspection data set or design data set used as a reference to compare to photomask features. The manipulation of the data set provides for merging features to eliminate sub-groundrule spaces and deleting sub-groundrule printed shapes.

Figure 1:
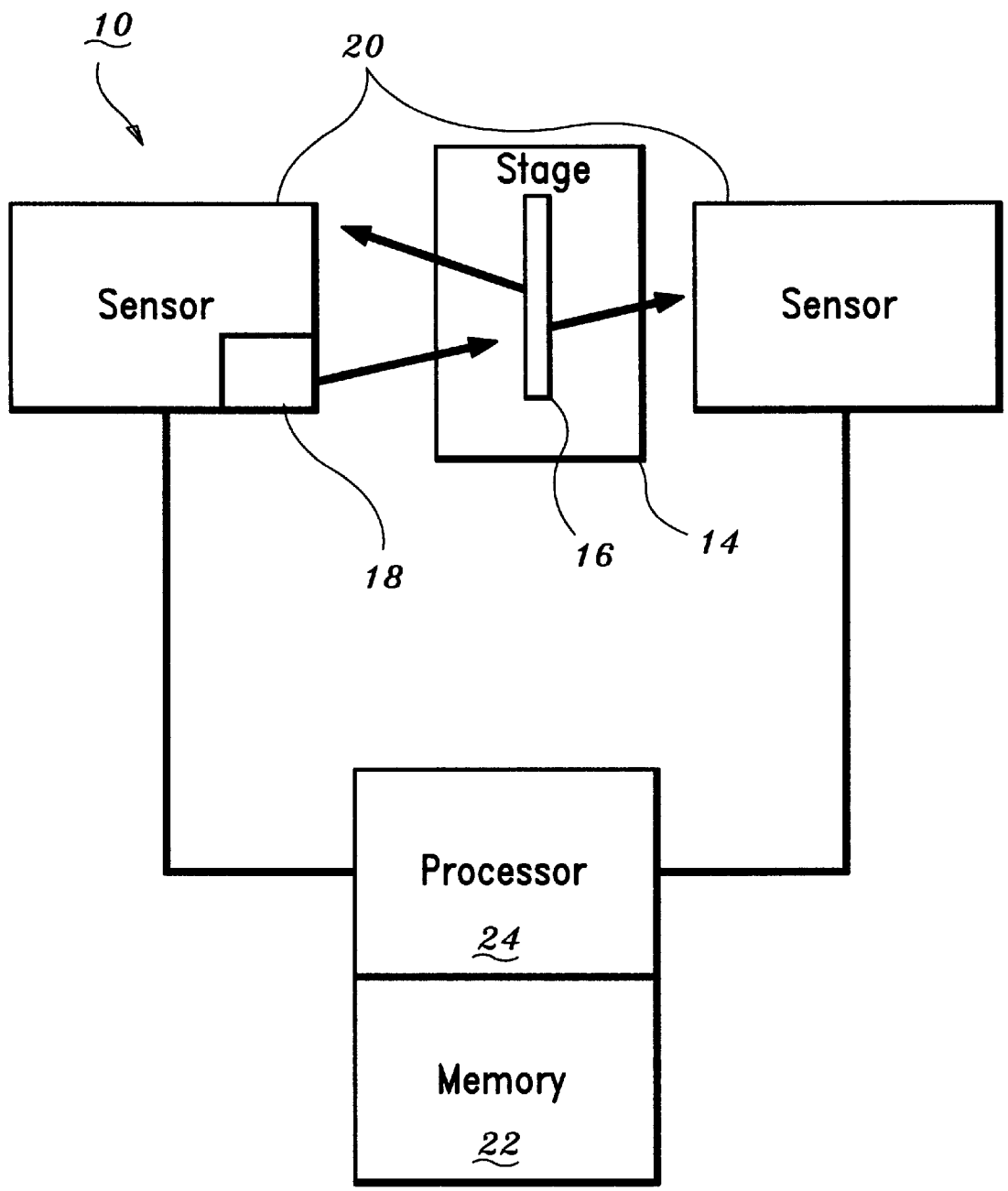
FIG. 1 is a block diagram showing a conventional inspection system for inspecting photomasks.
Figure 3:
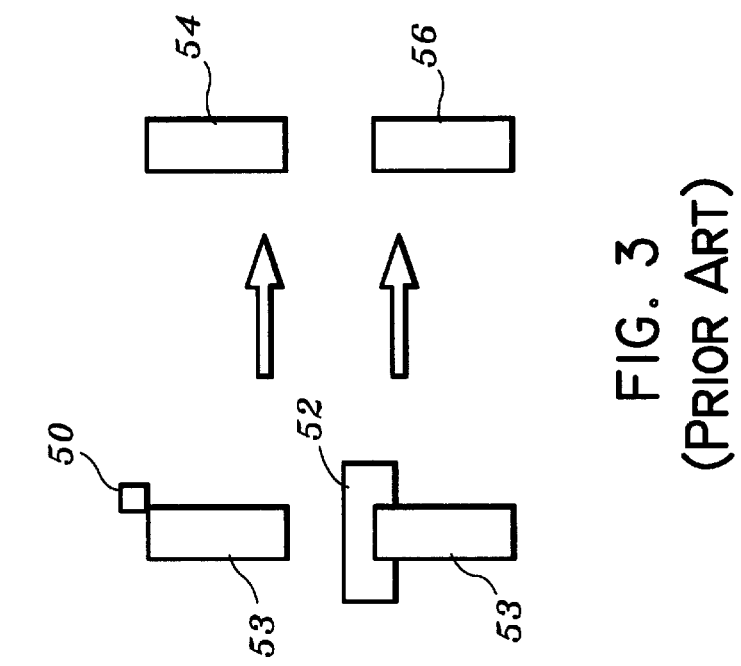
FIG. 3 illustratively depict the use of serif s in accordance with the prior art.
Figure 2:
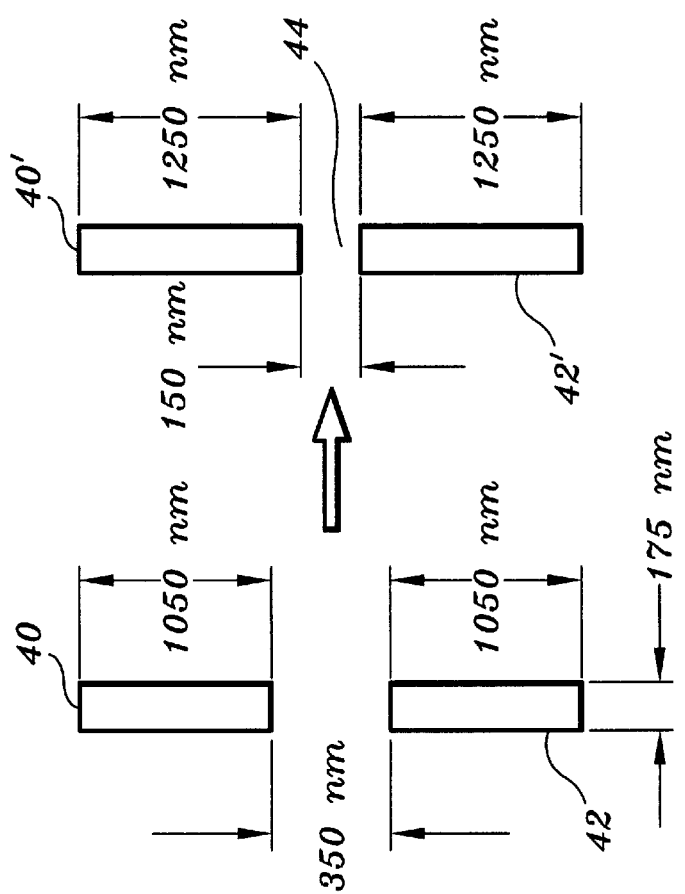
FIG. 2 illustratively depicts an example of biasing in accordance with the prior art.
Figure 4:
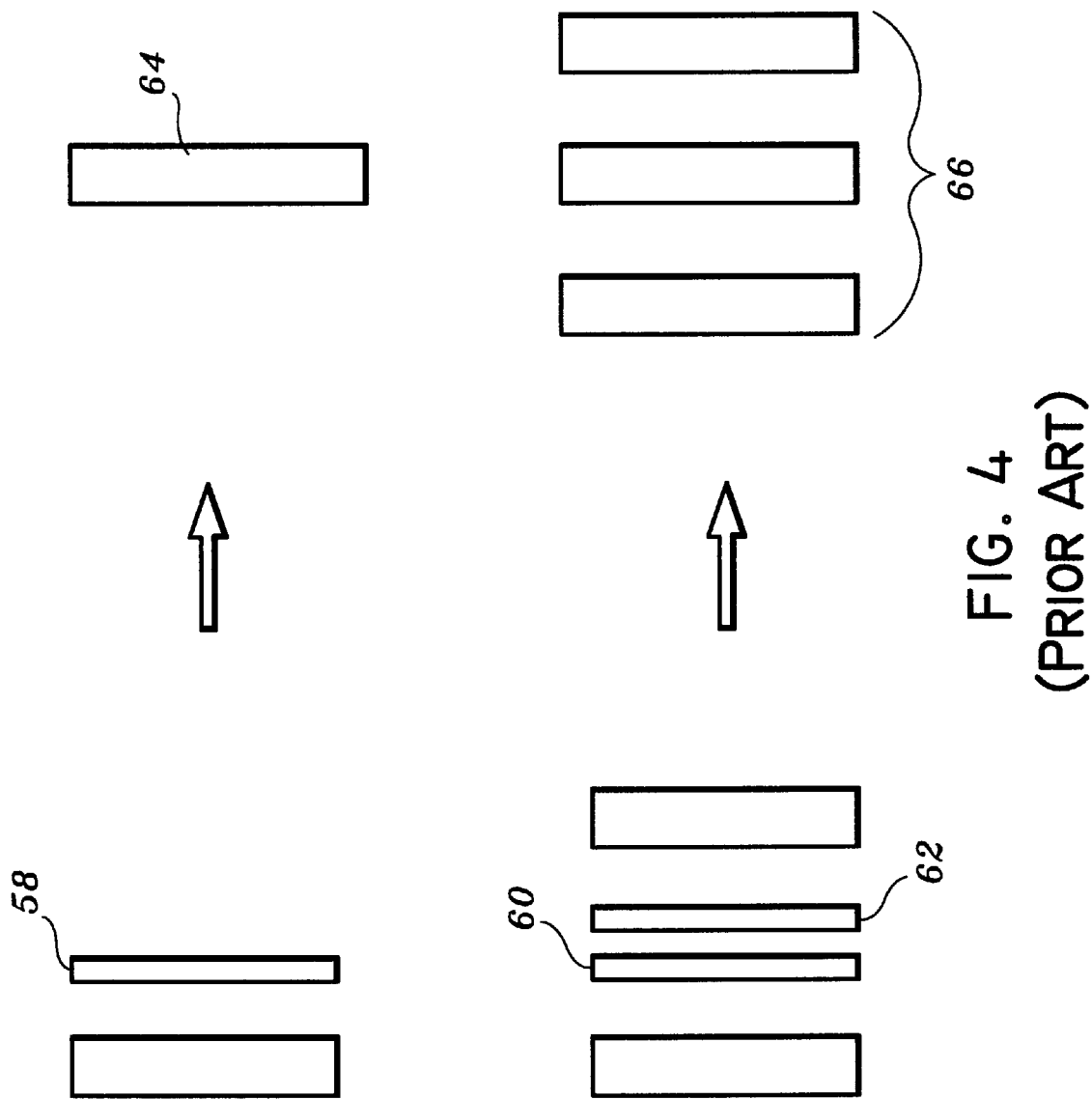
FIG. 4 illustratively depict the use of assist features in accordance with the prior art.
Figure 5:
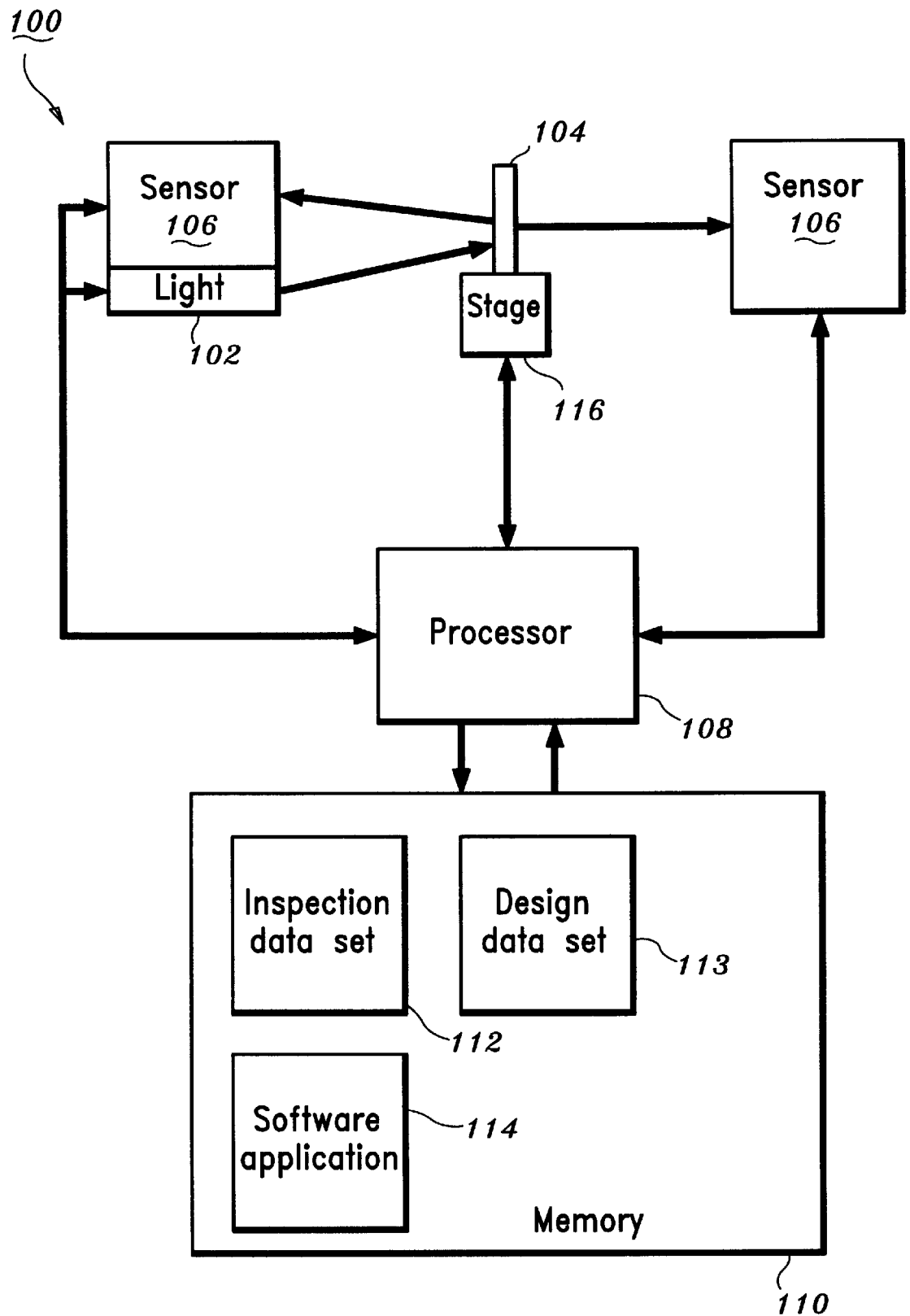
FIG. 5 is a block diagram showing an inspection system for inspecting photomasks in accordance with the present invention.

Referring now in specific detail to the drawings in which like reference numerals identify similar or identical elements throughout the several views, FIG. 5, a block diagram for a system 100 in accordance with the present invention is shown. System 100 includes a light source 102 which provides light for passing through a photomask 104 to be inspected. Photomask 104 includes a pattern including shapes or features to be used for photolithography of semiconductors devices.

A sensor 106 is included for measuring light intensities both reflected and transmitted from and through photomask 104, respectively. A processor 108 is included which calculates the intensities of transmitted and reflected light to decipher a photomask pattern of photomask 104. Processor 108 includes a memory 110 for storing intensity data, etc. Memory 110 also includes an inspection data set 112 is comprised of an inspection pattern to be compared to the fabricated pattern on photomask 104. Inspection data set 112 is preferably created by employing a design data set 113 according to the present invention. A software application 114 is included in memory and executed by processor 108 to perform the inspection. A stage or automated motion device 116 is controlled by processor 108 for moving photomask 104 in the presence of light source 102, preferably a laser source, and more preferably an ultraviolet laser source such as an excimer laser. Alternately, laser source may be moved and photomask 104 may be stationary. Software application 114 preferably performs a light intensity comparison between data set 112 which includes a digital image of photomask 104 and photomask 104 itself.

As a result of smaller groundrules, for example groundrules less than one micron, photomask 104 includes sub-groundrule features to improve the fabrication of photomask 104. These features may include serifs, lines, spaces, etc. Further, to account for corner rounding, features of photomask are biased and may also include sub-groundrule shapes or shapes as described above.

In accordance with the present invention, sub-groundrule features, such as shapes, are deleted from data set 112, and spaces are eliminated by biasing adjacent features to merge into the space thereby eliminating the space from the inspection.

Figure 7:
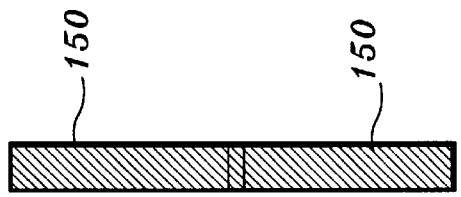
FIG. 7 is a top plan view of the magnified photomask features of FIG. 6 as modified to create an inspection data set by merging features to eliminate the space in accordance with the present invention.
Figure 6:
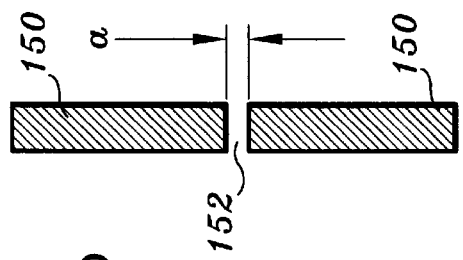
FIG. 6 is a top plan view of magnified photomask features as rendered in a design data set and showing a sub-groundrule space to be eliminated in accordance with the present invention.

Referring to FIGS. 6 and 7, sub-groundrule features are illustratively shown for a design pattern and an inspection pattern, respectively, in accordance with the present invention. FIG. 6 shows two segments 150 separated by a space 152 on photomask 104. Space 152 has a dimension "a" which is a sub-groundrule feature. In a preferred embodiment, segments 150 and 152 are digitally represented in a design data set created using computer aided design tools or by creating an intensity map of an actual photomask. After being digitally rendered, the design data set may be manipulated in accordance with the invention. Design data representing the sub-groundrule features of FIG. 6 is preferably used as reference data or data set 112 (FIG. 5). In FIG. 7, segments 150 are biased in length to eliminate space 152 therebetween. After merging segments 150, the data is stored in data set 112 to be used for inspection of photomask 104. In this way, when space 152 is encountered during inspection of photomask 104 a defect is advantageously not detected. This is due to the elimination of space 152 from data set 112. When a design data set is provided, it is preferable to run a search algorithm provide in software application 114 (FIG. 5) to search for sub-groundrule features such as assist features, serifs, etc. The search may be based on the size or area of the feature such that identified features are automatically eliminated from data set 112.

Figure 9:
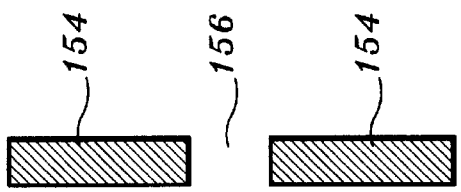
FIG. 9 is a top plan view of the magnified photomask features of FIG. 8 as modified to create an inspection data set by removing the line in accordance with the present invention.
Figure 8:
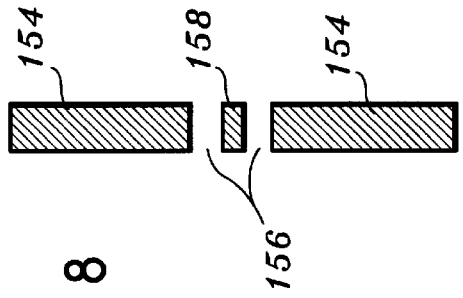
FIG. 8 is a top plan view of magnified photomask features as rendered in a design data set and showing a sub-groundrule line to be eliminated in accordance with the present invention.

Referring to FIGS. 8 and 9, sub-groundrule features are illustratively shown for a design pattern and an inspection pattern, respectively, in accordance with the present invention. FIG. 8 shows two segments 154 separated by spaces 156 and a sub-groundrule line segment 158 on photomask 104. Segment 158 has a dimension "b" which is a sub-groundrule feature. In a preferred embodiment, segments 154, spaces 156 and line segment 158 are digitally represented in a design data set created using computer aided design tools or by creating an intensity map of an actual photomask. After being digitally rendered, the design data set may be manipulated in accordance with the invention. Design data representing the sub-groundrule features of FIG. 8 is preferably used as reference data for data set 112 (FIG. 5). In FIG. 9, segments 154, are maintained in position while line segment 158 is eliminated. The data is altered in data set 112 to reflect the elimination of segment 158. In this way, when segment 158 is encountered during inspection of photomask 104 a defect is advantageously not detected. This is due to the elimination of space 152 from data set 112, used for inspection. When a design data set is provided, it is preferable to run a search algorithm provide in software application 114 (FIG. 5) to search for sub-groundrule features such as assist features, serifs, etc. The search may be based on the size or area of the feature such that identified features are automatically eliminated from data set 112. Once the features are located data set 112 is altered as described above to perform the inspection of photomask 104.

Figure 10:
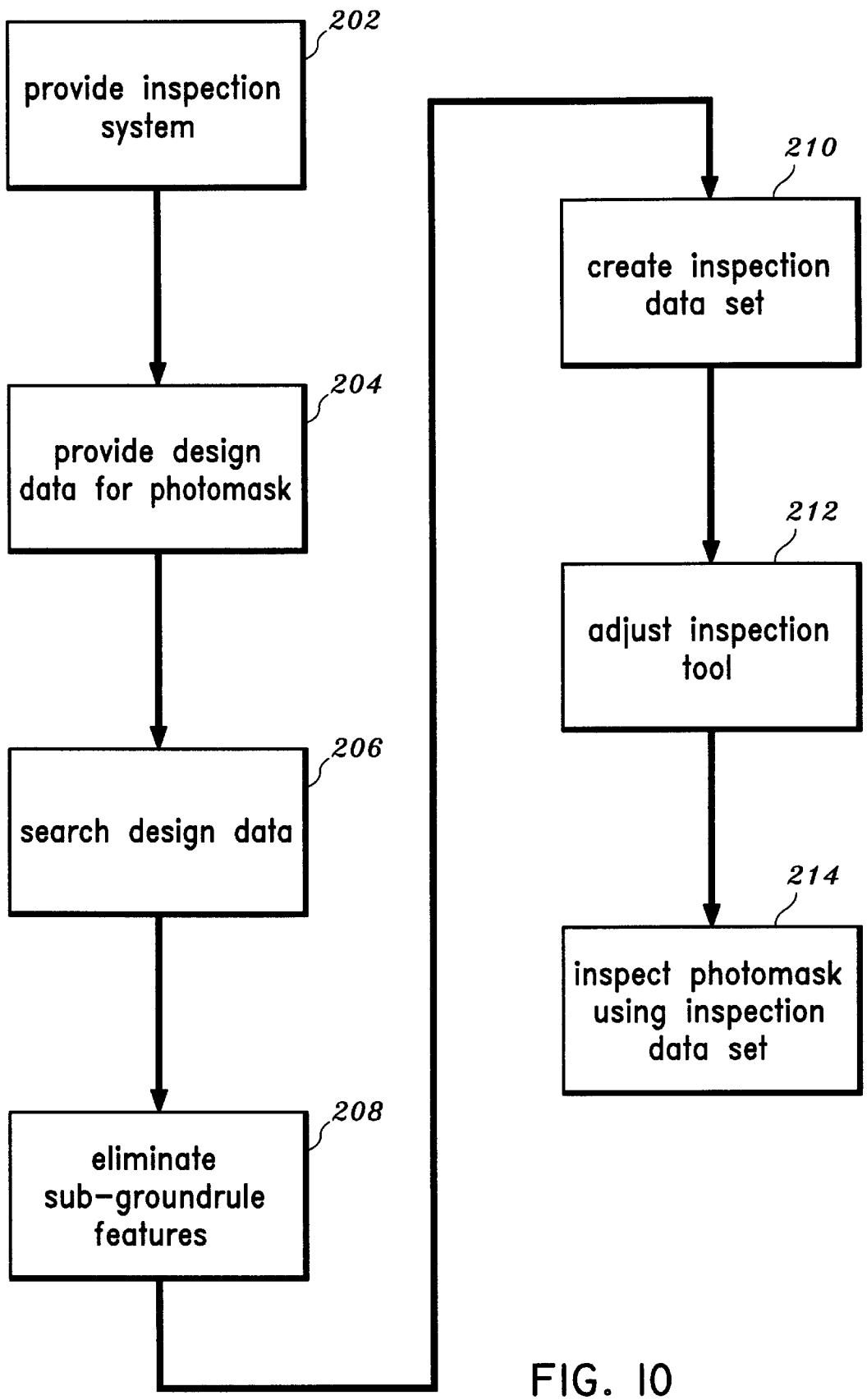
FIG. 10 is a block/flow diagram showing a system/method for inspecting photomasks in accordance with the present invention.

It should be understood that the elements shown in FIG. 10 may be implemented in various forms of hardware, software or combinations thereof. Preferably, these elements are implemented in software on one or more appropriately programmed general purpose digital computers having a processor and memory and input/output interfaces. Referring now to the drawings in which like numerals represent the same or similar elements and initially to FIG. 10, a flow/block diagram is shown for a system/method for inspecting photomasks having sub-groundrule features in accordance with the present invention. In block 202, a system, for example system 100 (FIG. 5) is provided for inspecting photomasks. In block 204, a design data set for a photomask is provided or generated and store in a memory. In block 206, a search algorithm is executed, preferably by a software application using a processor to identify sub-groundrule features. The search algorithm searches the design data set for sub-groundrule features included in the photomask as, inter alia, assist features or as a result of biasing measures to stem corner rounding effects. The search may be performed using predetermined criteria, such as area of a feature, minimum length of the feature or distance between features (spaces). In block 208, identified features are merged by biasing for spaces and/or eliminated for lines or areas by employing the processor. In block 210, an inspection data set is created based on the modified design data. In block 212, the inspection criteria is adjusted such that sub-groundrule features present on a photomask produced according to the design data will not be recognized by the inspection tool (system 100). In this way, the photomask will become inspectable to a criteria close to the size of the sub-groundrule features. In block 214, an actual photomask fabricated using the design data is inspected by employing system 100 with the inspection data modified to eliminate sub-groundrule features in accordance with the invention.

Having described preferred embodiments for an improved system and method for automated defect inspection of photomasks (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for inspecting photomasks comprising the steps of:

providing a design data set for fabricating a photomask;

searching the design data set for sub-groundrule features;

eliminating the sub-groundrule features from the data set to form an inspection data set; and inspecting a photomask fabricated in accordance with the design data set by employing the inspection data set.

2. The method as recited in claim 1, wherein the sub-groundrule features include sub-groundrule spaces and the step of eliminating the sub-groundrule features further comprises the step of merging features of the design data set which are adjacent to the spaces such that the spaces are eliminated in the inspection data set.

3. The method as recited in claim 2, wherein the step of merging features includes merging features by employing a biasing process.

4. The method as recited in claim 1, wherein the photomask includes sub-groundrule lines and the step of eliminating the sub-groundrule features further comprises the step of removing the sub-groundrule lines from the design data set to provide the inspection data set.

5. The method as recited in claim 1, wherein the step of searching the design data set for sub-groundrule features includes the step of searching the design data set for sub-groundrule features according to predetermined feature size criteria.

6. The method as recited in claim 1, wherein the step of inspecting the photomask fabricated in accordance with the design data set by employing the inspection data set includes the step of adjusting a sensitivity of an inspection tool to overlook the sub-groundrule features.

7. The method as recited in claim 1, wherein the step of providing a design data set for fabricating a photomask includes providing a computer rendered digital pattern for fabricating the photomask.

8. A method for inspecting photomasks comprising the steps of:

providing a design data set for fabricating a photomask;

identifying sub-groundrule features in the design data set which meet predetermined size criteria;

forming an inspection data set by eliminating the identified sub-groundrule features from the design data set;

providing an inspection tool for comparing a photomask fabricated in accordance with the design data set to the data of the inspection data set;

adjusting the inspection tool such that identified sub-groundrule features are overlooked; and inspecting the fabricated photomask by employing the inspection data set.

9. The method as recited in claim 8, wherein the sub-groundrule features include sub-groundrule spaces and the step of forming an inspection data set further comprises the step of merging features of the design data set which are adjacent to the spaces such that the spaces are eliminated in the inspection data set.

10. The method as recited in claim 9, wherein the step of merging features includes merging features by employing a biasing process.

11. The method as recited in claim 8, wherein the sub-groundrule features include sub-groundrule lines and the step of forming an inspection data set further comprises the step of removing the sub-groundrule lines from the design data set to provide the inspection data set.

12. The method as recited in claim 8, wherein the step of searching the design data set for sub-groundrule features includes the step of searching the design data set for sub-groundrule features according to predetermined feature size criteria.

13. The method as recited in claim 8, wherein the step of providing a design data set for fabricating a photomask includes providing a computer rendered digital pattern for fabricating the photomask.

14. A program storage device readable by machine, tangibly embodying a program of instructions executable by the machine to perform method steps for inspecting photomasks, the method steps comprising:

providing a design data set for fabricating a photomask;

searching the design data set for sub-groundrule features;

eliminating the sub-groundrule features from the data set to form an inspection data set; and inspecting a photomask fabricated in accordance with the design data set by employing the inspection data set.

15. The program storage device as recited in claim 14, wherein the sub-groundrule features include sub-groundrule spaces and the step of eliminating the sub-groundrule features further comprises the step of merging features of the design data set which are adjacent to the spaces such that the spaces are eliminated in the inspection data set.

16. The program storage device as recited in claim 15, wherein the step of merging features includes merging features by employing a biasing process.

17. The program storage device as recited in claim 14, wherein the photomask includes sub-groundrule lines and the step of eliminating the sub-groundrule features further comprises the step of removing the sub-groundrule lines from the design data set to provide the inspection data set.

18. The program storage device as recited in claim 14, wherein the step of searching the design data set for sub-groundrule features includes the step of searching the design data set for sub-groundrule features according to predetermined feature size criteria.

19. The program storage device as recited in claim 14, wherein the step of inspecting the photomask fabricated in accordance with the design data set by employing the inspection data set includes the step of adjusting a sensitivity of an inspection tool to overlook the sub-groundrule features.

20. The method as recited in claim 14, wherein the step of providing a design data set for fabricating a photomask includes providing a computer rendered digital pattern for fabricating the photomask.

* * * * *